United States Patent
Jafarian-Tehrani (10) Patent No.: US 7,435,926 B2
(45) Date of Patent: Oct. 14, 2008

(54) METHODS AND ARRAY FOR CREATING A MATHEMATICAL MODEL OF A PLASMA PROCESSING SYSTEM

(75) Inventor: Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 434 days.

(21) Appl. No.: 10/816,211

(22) Filed: Mar. 31, 2004

(65) Prior Publication Data
US 2005/0217797 A1 Oct. 6, 2005

(51) Int. Cl.
*B23K 10/00* (2006.01)
(52) U.S. Cl. ............... 219/121.59; 219/121.54; 219/121.43; 118/723 I; 156/345.47
(58) Field of Classification Search .............. 219/121.4, 219/121.43, 121.41, 121.44, 121.54, 121.59, 219/121.52; 118/723 R, 723 I; 156/345.47, 156/345.43, 345.44
See application file for complete search history.

(56) References Cited

U.S. PATENT DOCUMENTS

| 6,858,112 B2 * | 2/2005 | Flamm et al. ........... 156/345.48 |
| 6,911,092 B2 * | 6/2005 | Sneh ........................ 118/715 |
| 2005/0067386 A1 * | 3/2005 | Mitrovic ................ 219/121.43 |
| 2006/0088655 A1 * | 4/2006 | Collins et al. ................ 427/8 |

OTHER PUBLICATIONS

Stout et al., "Modeling Plasma Tools: Reactor and Feature Scales," pp. 1-6, http://www.google.com/search?q=cache:IPSvCEvzlTsJ:cfdplasma.trancetechno.com/vmic_2000.pdf+%22inductively+coupled+plasma%22+%22shower+head%22&hl=en&ie=UTF-8.

* cited by examiner

*Primary Examiner*—Mark H Paschall
(74) *Attorney, Agent, or Firm*—IP Strategy Group, P.C.

(57) ABSTRACT

A method of creating a simplified equivalent circuit model of a plasma processing system, including an electrical measuring device, a lower electrode, an upper electrode, and a signal generator device is described. The method includes creating a simplified equivalent circuit equation, including a set of variables, of the plasma processing system, wherein the electrical measuring device comprises a first subset of variables, the lower electrode comprises a second subset of variables, the upper electrode comprises a third subset of variables, and the signal generator device comprises a forth subset of variables. The method also includes generating a set of signals, each of the set of signals being generated at a different frequency, wherein the signal generator device is coupled to the electrical measuring device, the lower electrode, and the upper electrode. The method further includes measuring the set of signals with the electrical measuring device, wherein at least one measured signal is generated for each of the set of variables; and, creating a simplified equivalent circuit model from the set of signals.

21 Claims, 6 Drawing Sheets

METHODS AND ARRAY FOR CREATING A MATHEMATICAL MODEL OF A PLASMA PROCESSING SYSTEM

BACKGROUND OF THE INVENTION

The present invention relates in general to substrate manufacturing technologies and in particular to methods and array for creating a mathematical model of a plasma processing system.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Figure 1:
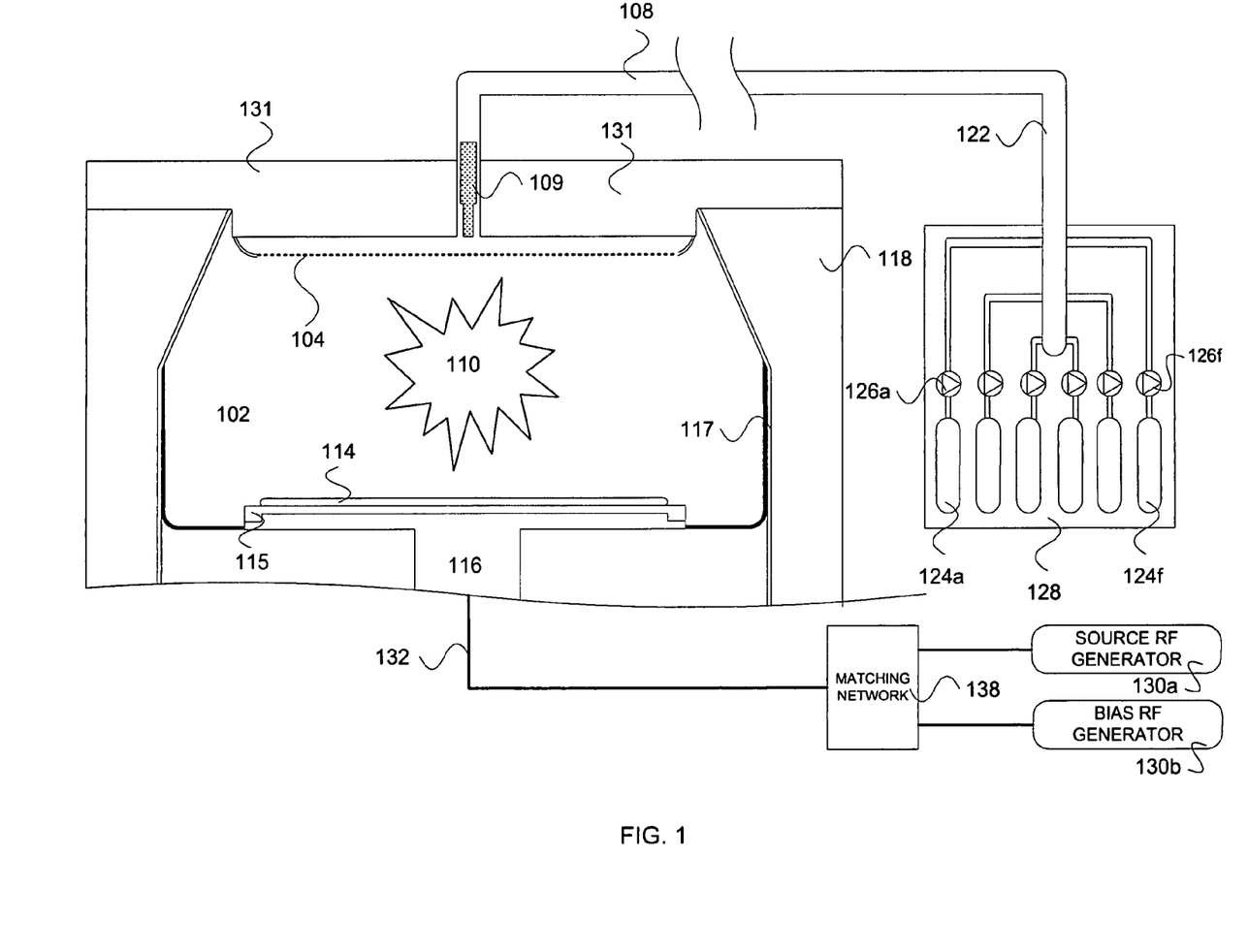
FIG. 1 shows a simplified diagram of a plasma processing system.

Referring now to FIG. 1, a simplified diagram of a capacitively coupled plasma processing system is shown. Generally, capacitvely coupled plasma processing systems may be configured with a single or with two separate RF power sources. Source RF, generated by source RF generator 130a, is commonly used to generate the plasma as well as control the plasma density via capacitively coupling. While bias RF, generated by bias RF generator 130b, is commonly used to control the DC bias and the ion bombardment energy. Further coupled to source RF generator 130a and bias RF generator 130b is matching network 138, that attempts to match the impedance of the RF power sources to that of plasma 110, through RF feed 132.

Generally, an appropriate set of gases is flowed into chamber 102 through an inlet in top plate 131 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116, which also serves as the lower electrode. In addition, liner 117 provides a thermal barrier between the plasma and the plasma processing chamber, as well as helping to optimize plasma 110 on substrate 114.

Gas distribution system 122 is commonly comprised of compressed gas cylinders 124a-f containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a-f may be further protected by an enclosure 128 that provides local exhaust ventilation. Mass flow controllers 126a-f are commonly a self-contained devices (consisting of a transducer, control valve, and control and signal-processing electronics) commonly used in the semiconductor industry to measure and regulate the mass flow of gas to the plasma processing system. Injector 109 introduces plasma processing gases 124 as an aerosol into chamber 102 through shower head 104, which also serves as the upper electrode.

Generally, some type of cooling system is coupled to electrostatic chuck 116 in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole. Generally, an opening is formed in a dielectric layer, usually lined with a TaN or TiN barrier, and then subsequently filled with a conductive material (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of silicon nitride is then deposited to cap the copper.

However, with these and other plasma processes, it is often difficult to monitor the plasma process, and hence to preclude potential manufacturing defects caused by incorrectly installed, improperly manufactured, or damaged components.

For example, pollutants may be cleaned from the plasma processing system by striking the plasma without the substrate. However, since the electrostatic chuck (chuck) is no longer shielded by the substrate, it is subsequently etched. Eventually, the plasma processing system cannot adequately compensate, and the process recipe's parameters are invalidated. Since it is often impractical to determine when this point is exactly reached, the chuck is generally replaced after a certain amount of operational hours, which in practice is normally only a fraction of its useful life. This can both increase productions costs, since an expensive chuck may be needless replaced, and reduces yield, since the plasma processing system must be taken offline for several hours to replace the chuck.

One solution is to create a simplified empirical model of the plasma processing system in order to sufficiently capture the behavior of the tool. However, creating an empirical model may be problematic. For example, a modified non-operational plasma chamber may be analyzed in order to extract parameters for the simplified empirical. In another technique, the individual components of a plasma processing system may be individually measured using a network analyzer. However, even a loosely correlated (and hence weakly predictive) model is difficult to obtain since repetition of the plasma process itself may effect of the electrical characteristics of plasma processing system components. In addition, the extraction process may be difficult to automate, since the cost of a network analyzer may prohibit its integration into most plasma processing systems. The creation of simplified empirical models may only be done infrequently, and only by trained personnel.

In view of the foregoing, there are desired methods and array for creating a mathematical model of a plasma processing system.

SUMMARY OF THE INVENTION

The invention relates, in one embodiment, in a plasma processing system, to a method of creating a simplified equivalent circuit model of a plasma processing system, including an electrical measuring device, a lower electrode, an upper electrode, and a signal generator device. The method includes creating a simplified equivalent circuit equation, including a set of variables, of the plasma processing system, wherein the electrical measuring device comprises a first subset of variables, the lower electrode comprises a second subset of variables, the upper electrode comprises a third subset of variables, and the signal generator device comprises a forth subset of variables. The method also includes generating a set of signals, each of the set of signals being generated at a different frequency, wherein the signal generator device is coupled to the electrical measuring device, the lower electrode, and the upper electrode. The method further includes measuring the set of signals with the electrical measuring device, wherein at least one measured signal is generated for each of the set of variables; and, creating a simplified equivalent circuit model from the set of signals.

The invention relates, in one embodiment, in a plasma processing system, to an array for creating a simplified equivalent circuit model of a plasma processing system, including an electrical measuring device, a lower electrode, an upper electrode, and a signal generator device. The array includes a first array element for creating a simplified equivalent circuit equation, including a set of variables, of the plasma processing system, wherein the electrical measuring device comprises a first subset of variables, the lower electrode comprises a second subset of variables, the upper electrode comprises a third subset of variables, and the signal generator device comprises a forth subset of variables. The array also includes a second array element for generating a set of signals, each of the set of signals being generated at a different frequency, wherein the signal generator device is coupled to the electrical measuring device, the lower electrode, and the upper electrode. The array further includes a third array element for measuring the set of signals with the electrical measuring device, wherein at least one measured signal is generated for each of the set of variables; and a forth array element for creating a simplified equivalent circuit model from the set of signals. The array also includes a fifth array element for ascertaining from the simplified equivalent circuit model a state of a component of the plasma processing system, wherein the state is one of an acceptable state and an unacceptable state.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a simplified model can be used to determine and/or predict potential problems in a plasma processing system. That is, a set of models can be created, and then subsequently compared, in order to determine potential manufacturing defects caused by incorrectly installed, improperly manufactured, or damaged plasma processing system components.

In one embodiment, a simplified equivalent circuit can be created. In another embodiment, the parameters for the simplified equivalent circuit can be extracted in a substantially automated fashion. In another embodiment, a set of simplified equivalent circuit models is created, wherein an initial base model may act as the baseline for the plasma processing system before commissioning for production, and compared to subsequently created models in order to establish trends. In another embodiment, a new baseline is created after a plasma processing system wet clean. In another embodiment, the baseline model is created for a plasma processing system without plasma.

In another embodiment, only a broad band probe, a lower electrode and an upper electrode are used to create the simplified equivalent circuit. In another embodiment, the RF path is modeled. In another embodiment, the simplified equivalent circuit model is created in a substantially automated fashion. In another embodiment, the simplified equivalent circuit model will predict system losses allowing actual power balance calculation for losses and power density absorption in the plasma processing system. In another embodiment, the simplified equivalent circuit may predict the overall system frequency response and its behavior at harmonic frequencies. In another embodiment, the parameter data will be routed automatically to an embedded parameter extraction program.

In another embodiment, the simplified equivalent circuit may be stored in the plasma processing system memory for subsequent plasma parameter calculation and plasma chamber comparison when troubleshooting hardware problems. In another embodiment, measuring chamber impedance at operating frequencies will only estimate the dominant electrical components.

In many modern plasma processing systems, the plasma is typically generated by RF power applied between two parallel plate electrodes (e.g., upper electrode, lower electrode, etc.) in a vacuum chamber. Commonly called capacitively coupled plasma, the RF power source excites the plasma by generating a sinusoidal current source of frequency ω. A sinusoidal current source, in turn, may be modeled as a resonant circuit by appropriately coupling sets of electrical components together (e.g., resistors, capacitors inductors, etc.). In a plasma processing system, a simplified equivalent circuit model may generally be comprised of two sets of components, a plasma model set and a RF-path set.

The plasma model may consist of a set of analytical relations that describe the time-dependent plasma currents. The total current from the plasma may consist of a set of components (e.g., ion, secondary electron, plasma electron, and displacement currents), and can be modeled using an appropriate method. For example, the plasma may be modeled as a transformer circuit comprising a parallel resistance, representing the core power loss of the plasma, and a parallel inductance, which accounts for the coupling of magnetic flux to the plasma.

The RF-path model may consist of a set of resistors, capacitors, and inductors, expressed in the form of differential equations. In general, the voltage across an inductor is proportional to the time derivative of the current through the inductor and the voltage across a capacitor is proportional to the integral of the current through the capacitor.

In a non-obvious fashion, for a particular plasma processing system, a simplified equivalent circuit may be created by first obtaining a first set of measurements cold (i.e., no substantial plasma present) and a second set of measurements hot (i.e., substantial plasma present). Generally, in order to create a substantially accurate simplified equivalent circuit comprised of N variables or elements, N+1 measurements are needed. Since a cold plasma processing system has no plasma present (and hence has null values for the plasma model), the initial creation of the simplified equivalent circuit is substantially simplified. That is, fewer simplified equivalent circuit variables may need to be solved. In addition, the plasma tends to also affect the electrical characteristics of the existing components, further making the calculation of the simplified equivalent circuit difficult.

By generating a set of signals at different frequencies, a corresponding set of functions that can be created, which subsequently can be solved to determine the function values (e.g., resistance, capacitance, inductance, etc.) and hence create a simplified equivalent circuit model. Subsequently, function variables derived from the cold plasma processing system can be used to generate the equivalent simplified equivalent circuit model for the corresponding hot plasma processing system (combining the plasma model and the RF model). Later created models may then be compared to earlier created models in order to effectively monitor the plasma process, and hence to preclude an unacceptable state, such as potential manufacturing defects caused by incorrectly installed, improperly manufactured, or damaged components. By measuring voltage, current, and phase at the proper location, the equivalent plasma impedance as seen by the lower electrode can be deduced. The subsequent voltage and current measurements may predict the voltage, current, and the phase at the electrode as well. In addition, by the applying common energy conservation principals, power loss in the lower electrode and associated RF connections, as well as deposited power in the plasma, may be estimated.

For example, a properly configured chuck may have a capacitance value within a specified range. If the simplified equivalent circuit model calculates a capacitance value that is outside the range, then the chuck may be incorrectly installed, improperly manufactured, or damaged.

This process may further be automated by coupling a V/I (voltage/current) probe and a signal generator directly to the plasma processing system. As previously stated, network analyzers are generally optimized to monitor a wide frequency band, and hence can be very expensive. The use of a V/I probe and a signal generator, however, is generally less costly since only a specific set of frequencies are being generated and monitored. For example a V/I probe may be attached to a plasma processing system via junction box, and subsequently coupled to a small 5-20 W broad band RF generator. Through the use of appropriate software, the V/I probe may provide voltage, current and phase. Frequency (ω) may be extracted from the signal generator to reduce any ambiguity from V/I probe frequency measurement. The software may then calculate the parameters and record the values for trend control.

In many plasma processing systems, however, only the fundamental frequency measurement may be done through normal RF delivery path. Subsequently, in one embodiment, an auxiliary input is coupled to the RF delivery path in order to obtain the proper measurement without interference with the normal operation of the RF delivery system. For example, a simple small value feed capacitor (e.g., about 5-10 pF, etc.) may be connected to a commercially available RF connector with small parasitic capacitance (e.g., less than about 2 pF). In an alternate embodiment, the switching scheme could involve a vacuum relay to switch between RF feed strap for normal operation or to the broad band generator for measurement operation. In this case, all of the measurement including the fundamental frequencies may be done through the auxiliary input with RF delivery system disconnected through the relay.

Figure 2:
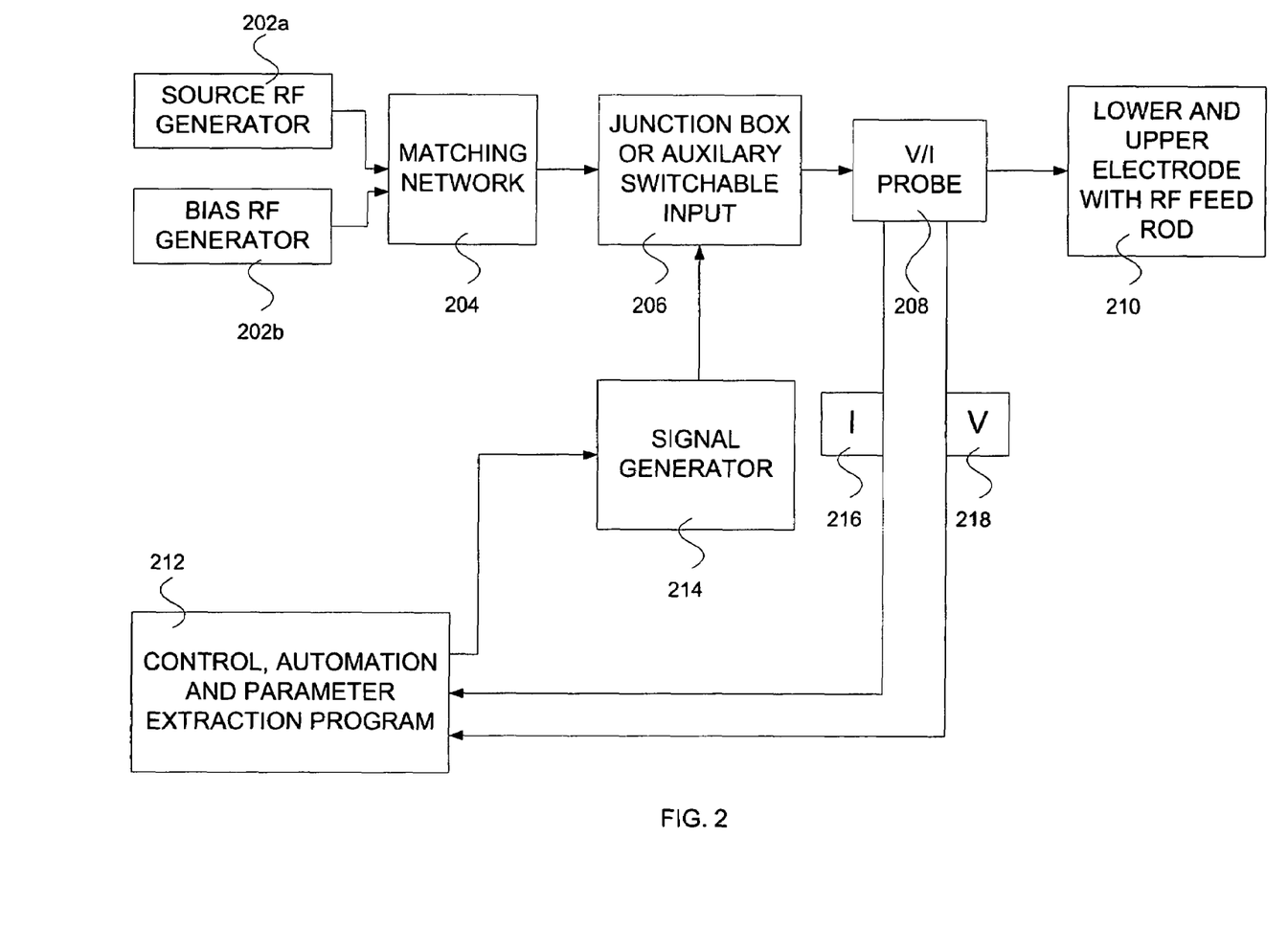
FIG. 2 shows a simplified diagram of a plasma processing system, according to one embodiment of the invention.

Referring now to FIG. 2, a simplified diagram of a plasma processing system is shown, according to one embodiment of the invention. As previously described, a source RF generator 202a and a bias RF generator 202b may be coupled to a matching network 204, that in turn, may be coupled to a plasma chamber through a junction box or auxiliary switchable input 206. However, in a non-obvious fashion, a signal generator 214 may be also coupled to junction box or auxiliary switchable input 206. By generating a set of signals at different frequencies, signal generator 214 allows a set of functions to be created, which subsequently can be solved to determine function variables (e.g., resistance, capacitance, inductance, etc.) and create a simplified equivalent circuit model. Junction box or auxiliary switchable input 206, in turn, is coupled to V/I probe 208, which can measure the current 216 and voltage 218 generated at lower and upper electrode with RF feed rod 210. In addition, a control, automation, and parameter extraction program 212 may also be coupled to signal generator 214 and V/I probe 208, and may create a simplified equivalent circuit in a substantially automated fashion.

Figure 3:
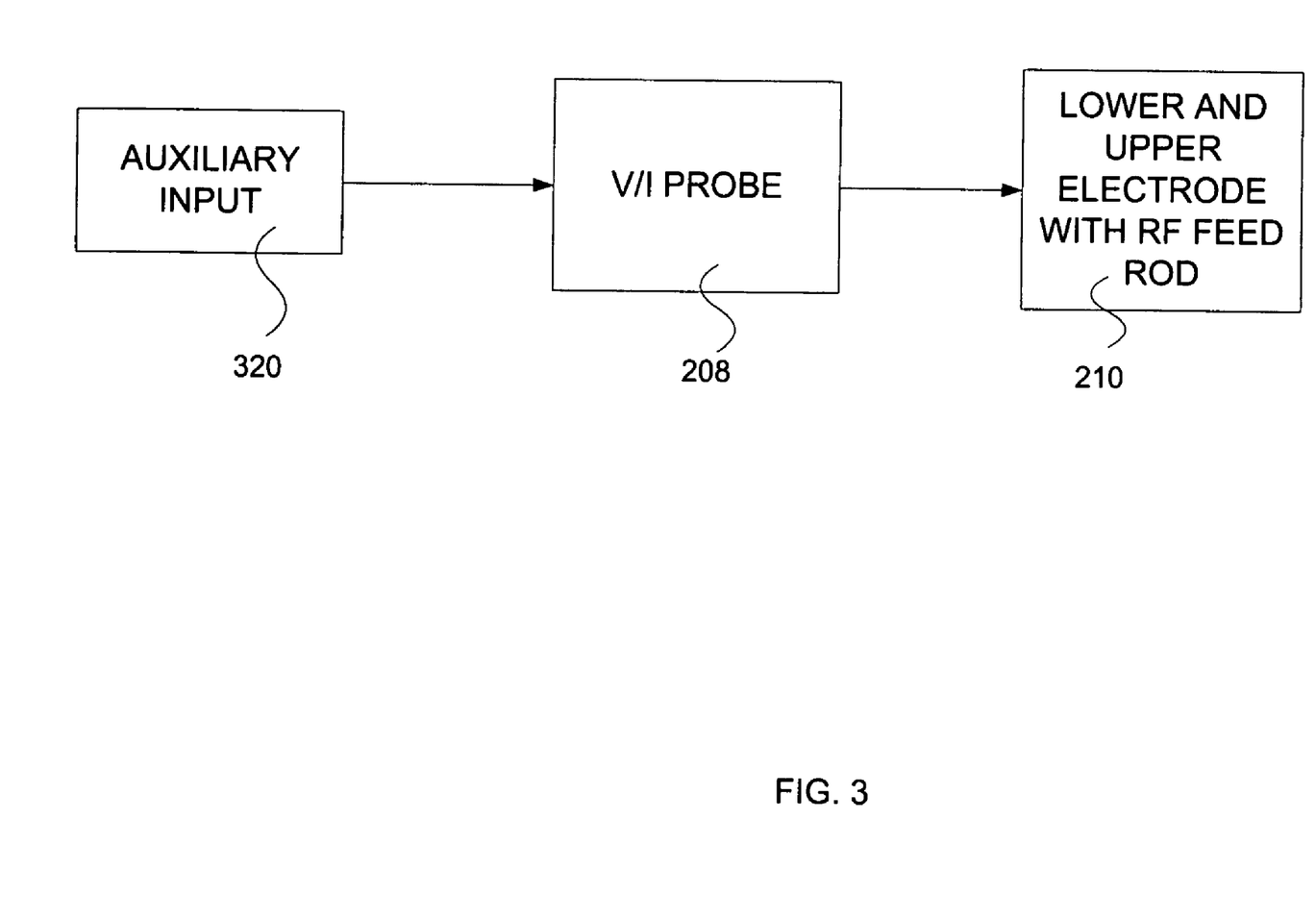
FIG. 3 shows the simplified diagram of FIG. 2, in which an auxiliary input is coupled to a V/I probe and a lower and upper electrode with RF feed rod.

Referring now to FIG. 3, the simplified diagram of FIG. 2 is shown, in which V/I probe 208 is coupled to auxiliary input 320 and lower and upper electrode with RF feed rod 210.

For example, for a particular signal generator that operates on a specific set of frequencies (e.g., 2 MHz, 27 MHz, etc.), an RF probe can be calibrated for a fundamental frequency and up to fifth harmonic frequencies. As previously stated, for N variables that may be solved in a simplified equivalent circuit, N+1 measurements (i.e., frequencies) are generally required. More data points will generally result in a better representation of equivalent electrical circuit model. That is, primary circuit values such as, electrode capacitance, RF feed rod inductance and other parameters can be better calculated. In addition, the generated model may be verified by coupling a network analyzer or impedance analyzer with a proper measurement fixture.

In general, voltage components within a simplified equivalent circuit model of a plasma processing system may be represented as a sinusoidal function in the form of:

$$V(t)=V_p \cos(\omega t+\theta_V) \quad \text{(Equation 1)}$$

where t is time, $V_p$ is the peak value of voltage, $\theta_V$ is the initial phase of the voltage, and $\omega$ is the angular frequency of the signals generated by the voltage sources, and can be represented in the form of:

$$\omega=2\pi(\text{Frequency}) \quad \text{(Equation 2)}$$

Likewise, in general, current components within a simplified equivalent circuit model of a plasma processing system may be represented in the form of a sinusoidal function in the form of:

$$i(t)=i_p \cos(\omega t+\theta_i) \quad \text{(Equation 3)}$$

where t is time, $i_p$ is the peak value of current, $\theta_i$ is the initial phase of the current, and $\omega$ is the angular frequency of the signals generated by the current sources.

Generally, the voltages and currents within capacitively coupled plasma systems are phasors, and hence can be represented as complex numbers. In general, when electrical elements are in a series, their impedances are added to provide an equivalent impedance. For parallel elements, the reciprocals of the impedances are added to provide the reciprocal of the equivalent impedance.

For example, the complex impedance of a resistor is generally its real resistance, and may be represented in the form of:

$$Z_R=R \quad \text{(Equation 4)}$$

where R is the real value of the corresponding modeled resistor.

Likewise, the complex impedance of a inductor is generally a function of frequency, and may be represented in the form of:

$$Z_L=j\cdot\omega\cdot L \quad \text{(Equation 5)}$$

where j=sqrt(−1), the imaginary part of a complex number, $\omega$ is the angular frequency of the generated signal, and L is the real value of the corresponding modeled inductor.

The complex impedance of a capacitor is generally a function of frequency, and may be represented in the form of:

$$Z_L=1/(j\cdot\omega\cdot C) \quad \text{(Equation 6)}$$

where j=sqrt(−1), the imaginary part of a complex number, $\omega$ is the angular frequency of the generated signal, and C is the real value of the corresponding modeled capacitor.

Figure 4:
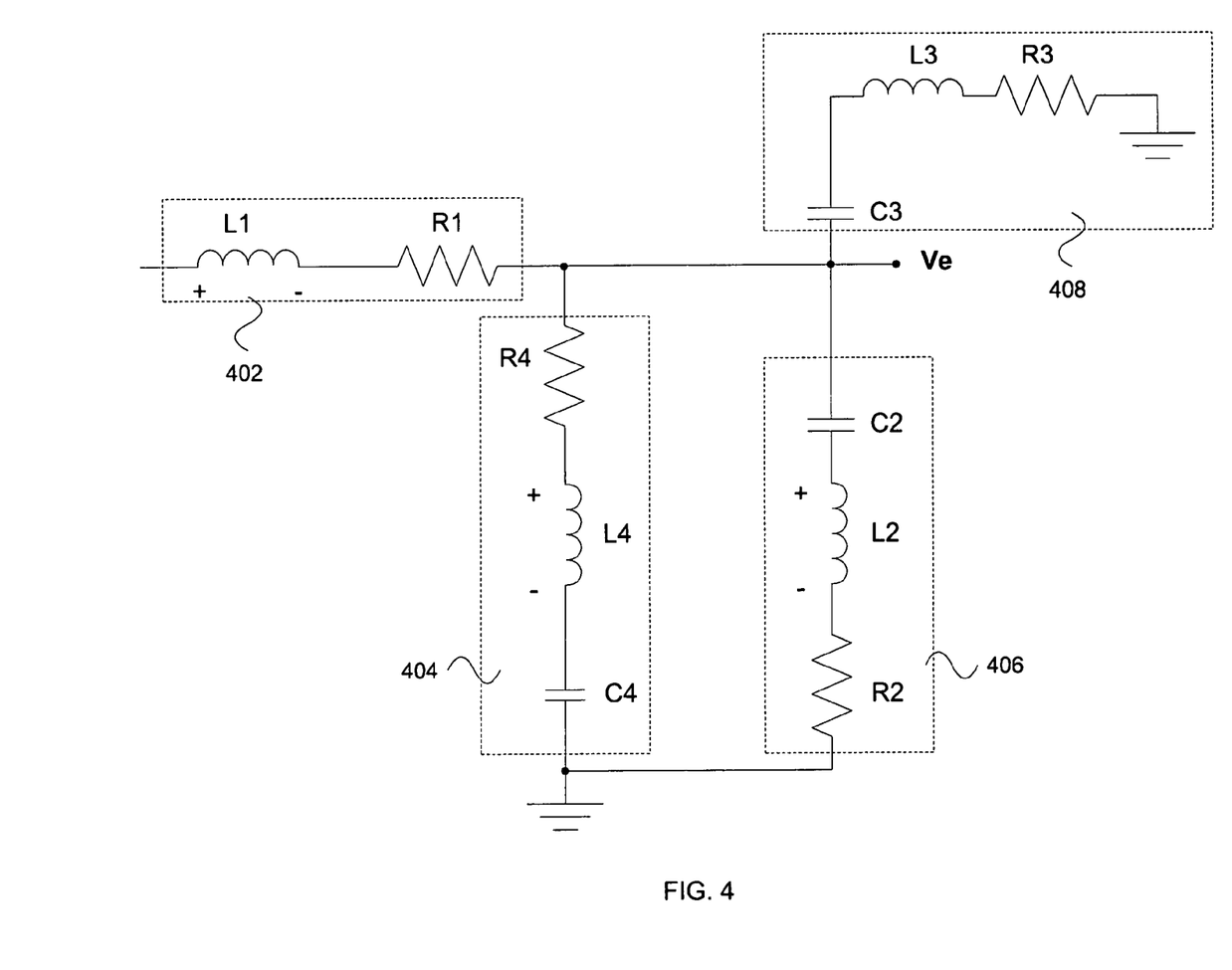
FIG. 4 shows a simplified equivalent circuit model for a cold plasma processing system as shown in FIG. 2, according to one embodiment of the invention.

Referring now to FIG. 4, a simplified equivalent circuit model is shown for a cold plasma processing system, as shown in FIG. 2, according to one embodiment of the invention. As previously stated, the plasma processing system itself may be modeled as a resonant circuit, by appropriately coupling sets of resistors, capacitors and inductors. The model may be comprised of a power filter 404 (comprising a resistor R4, inductor L4, and a capacitor C4), feed rod 402 (comprising an inductor L1 and a resistor R1), lower electrode 406, such a electrostatic chuck (comprising a resistor R2, inductor L2, and a capacitor C2), and a upper electrode 408 (comprising a resistor R3, inductor L3, and a capacitor C3).

Power filter 404 may produce an impedance Z4, and may be represented in the form of:

$$Z4=R4+j\cdot\omega\cdot L4+1/(j\cdot\omega\cdot C4) \quad \text{(Equation 7)}$$

Lower electrode 406 may produce an impedance Z2, and may be represented in the form of:

$$Z2=R\cdot 2+j\cdot\omega L2+1/(j\cdot\omega\cdot C2) \quad \text{(Equation 8)}$$

Upper electrode 408 may produce an impedance Z3, and may be represented in the form of:

$$Z3=R3+j\cdot\omega\cdot L3+1/(j\cdot\omega\cdot C3) \quad \text{(Equation 9)}$$

Subsequently, the total input impedance Zin and may be derived by combining Z1, Z2, Z3, and Z4 in the appropriate fashion, and may be represented in the form of:

$$Zin = j\cdot\omega\cdot L + R1 + \frac{(Z4\cdot Z2\cdot Z3)}{(Z4\cdot Z2 + Z4\cdot Z3 + Z3\cdot Z2)} \quad \text{(Equation 10)}$$

In addition, the total input impedance Zin and may also be represented in the form of:

$$Zin=|V|/|I| \quad \text{(Equation 11)}$$

Figure 5:
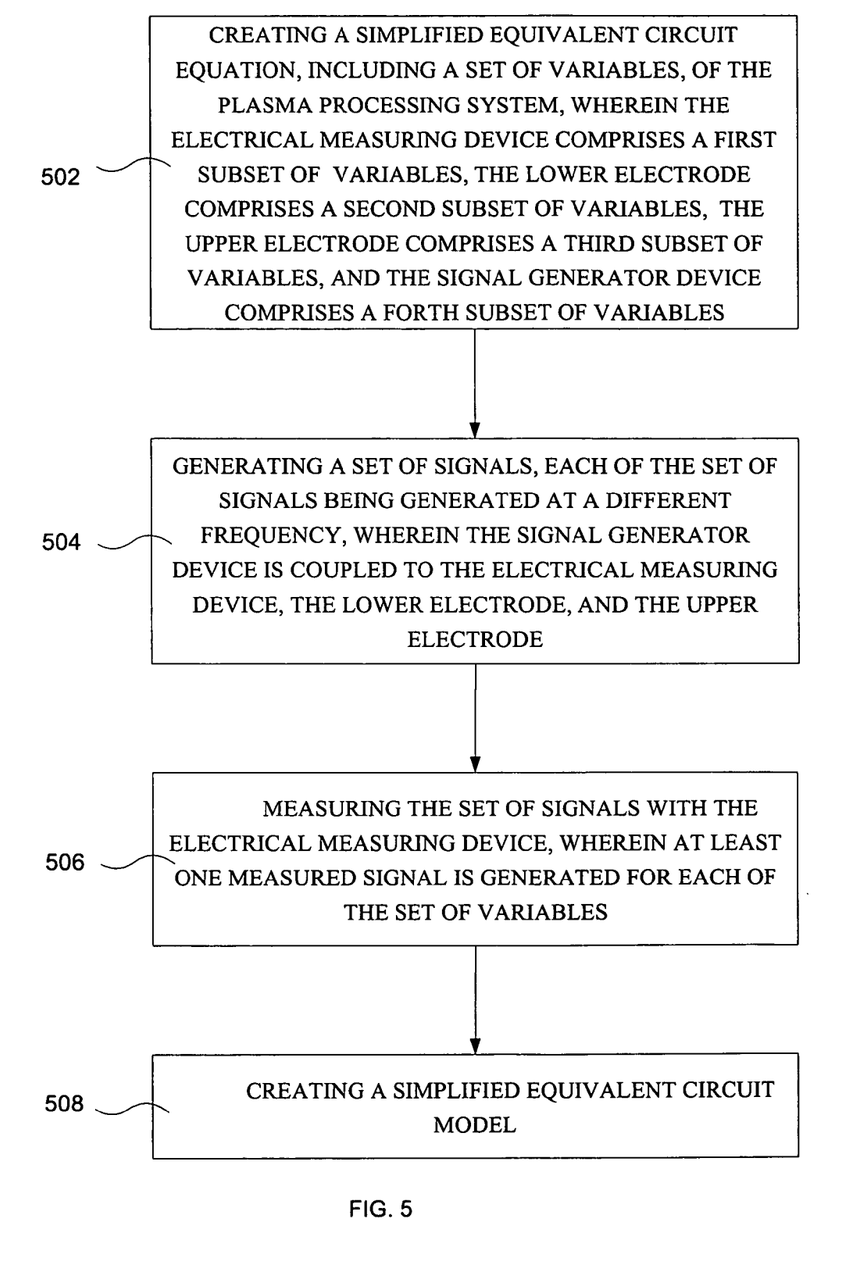
FIG. 5 shows a simplified method of creating a mathematical model of a plasma processing system, according to one embodiment of the invention.

Referring now to FIG. 5, a simplified method of creating a mathematical model of a plasma processing system is shown, according to one embodiment of the invention. Initially, a simplified equivalent circuit equation is created, including a set of variables, wherein the electrical measuring device comprises a first subset of variables, the lower electrode comprises a second subset of variables, the upper electrode comprises a third subset of variables, and the signal generator device comprises a forth subset of variables, at step 502. Next, a set of signals is generated, each of the set of signals being generated at a different frequency, wherein the signal generator device is coupled to the electrical measuring device, the lower electrode, and the upper electrode, at step 504. Next, the set of signals is measured with the electrical measuring device, wherein at least one measured signal is generated for each of the set of variables, at step 506. And finally, a simplified equivalent circuit model is created at step 508.

Figure 6:
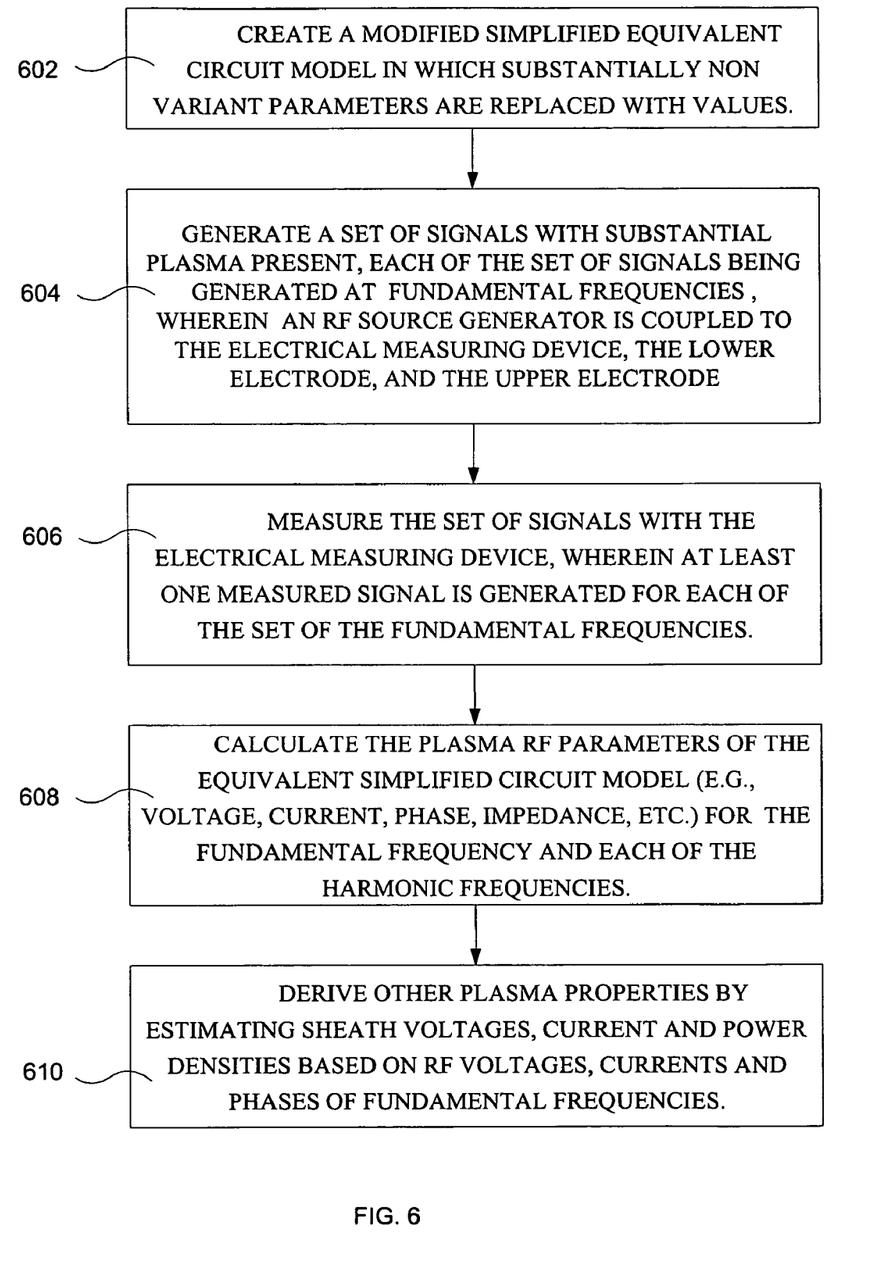
FIG. 6 shows the simplified method of using the mathematical model of FIG. 5, in which other plasma properties are derived according to one embodiment of the invention.

Referring now to FIG. 6, a simplified method of using the mathematical model of FIG. 5 is shown, in which other plasma properties derived according to one embodiment of the invention. Initially, a modified simplified equivalent circuit model is created in which substantially non-variant parameters are replaced with values at step 602. Non-variant parameters (e.g., impedance) refer to those plasma processing system component parameters (e.g., RF feed rod, chuck, etc.) that are substantially the same for the processing of a plurality of substrates in a given plasma configuration.

Next, a set of signals is generated with substantial plasma present, each of the set of signals being generated at the fundamental frequencies, wherein an RF source generator is coupled to the electrical measuring device, the lower electrode, and the upper electrode, at step 604. Next, the set of signals is measured with the electrical measuring device, wherein at least one measured signal is generated for each of the set of the fundamental frequencies, at step 606. Next, the plasma RF parameters of the equivalent simplified circuit model (e.g., impedance) is calculated for the fundamental frequency and each of the harmonic frequencies, at step 608. And finally, other plasma properties are derived by estimating sheath voltages, current and power densities based on RF voltages, currents and phases of fundamental frequencies, at step 610.

For example, a typical measurement result at ω1, 27.12 MHz in polar form:

$$\omega = 2 \cdot \pi \cdot 27.12 \cdot 10^6 \quad \text{(Equation 12)}$$

$$Z(\omega 1) = 7.82 \quad \text{(Equation 13)}$$

$$\text{Deg}(\omega 1) = -88.752 \quad \text{(Equation 14)}$$

The complex variable for ω1 will be:

$$Z(\omega 1) := \quad \text{(Equation 15)}$$

$$Z(\omega 1) \cdot \cos\left(\frac{\text{Deg}(\omega 1) \cdot \pi}{180}\right) + j \cdot Z(\omega 1) \cdot \sin\left(\frac{\text{Deg}(\omega 1) \cdot \pi}{180}\right)$$

$$Z(\omega 1) = 0.17 - 7.818i$$

Zin may then be equated with $Z(\omega 1)$ for frequencies from ω1 to ω10 to form ten equations and ten unknowns that you solve it by any solver programs (e.g., Excel, Mathcad, etc.) that can handle scenario solutions.

For example, a typical matrix formula in Mathcad to solve nine variables with minimum error may be represented as:

$$\begin{pmatrix} Cesc \\ Lesc \\ Resc \\ Ltop \\ Rtop \\ Lfil \\ Rfil \\ Lin \\ Rin \end{pmatrix} := \text{MinErr}(\text{Re}(C2), \text{Re}(L2), \text{Re}(R2), \text{Re}(L3), \text{Re}(R3), \text{Re}(L4), \text{Re}(R4), \text{Re}(L1), \text{Re}(R1)) \quad \text{(Equation 16)}$$

$$ERR = 1.541 \times 10^{-14}$$

In this case two variables may be measured directly, C2 top electrode capacitance at vacuum with no plasma and C4 filter capacitance which has a nominal value. All variables may be real and positive numbers. Calculated values may then be used as inputs for circuit simulation to predict circuit behavior for different conditions and Monte Carlo analysis.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). It should also be noted that there are many alternative ways of implementing the methods of the present invention.

Advantages of the invention include methods and array for creating a mathematical model of a plasma processing system. Additional advantages include potentially precluding manufacturing defects caused by incorrectly installed, improperly manufactured or damaged components. Other advantages include calculating a simplified equivalent circuit model in a substantially automated fashion.

Having disclosed exemplary embodiments and the best mode, modifications and variations may be made to the disclosed embodiments while remaining within the subject and spirit of the invention as defined by the following claims.

What is claimed is:

1. A method for determining a status of a component of a plasma processing system comprising:
    identifying a set of variables, the set of variables including at least one parameter of the component, the at least one parameter of the component pertaining to the status of the component;
    formulating an impedance as a function of the set of variables;
    operating the plasma processing system using a plurality of signals associated with different frequencies, at least two of the plurality of signals being provided to the plasma processing system at different times;
    measuring a set of voltage values, a set of phase values and a set of current values associated with at least one of an upper electrode and a lower electrode of the plasma processing system for the plurality of signals;
    calculating a set of values of the impedance using the set of voltage values, the set of phase values, and the set of current values;
    forming a set of equations using the function and the set of values of the impedance; and
    solving the set of equations to obtain a value of the at least one parameter of the component, the value of the at least one parameter of the component reflecting the status of the component.

2. The method of claim 1 further comprising:
    providing a range for the at least one parameter of the component; and
    comparing the value of the at least one parameter of the component with the range.

3. The method of claim 1 wherein the component comprises an electrode.

4. The method of claim 1 wherein the component comprises a lower electrode, the lower electrode configured to support a substrate for processing in the plasma processing system.

5. The method of claim 1 wherein the at least one parameter of the component includes a capacitance.

6. The method of claim 1 wherein the at least one parameter of the component includes a resistance.

7. The method of claim 1 wherein the at least one parameter of the component includes an inductance.

8. The method of claim 1 wherein the at least one of the upper electrode and the lower electrode is both of the upper electrode and the lower electrode.

9. The method of claim 1 wherein the set of variables includes at least one electrical property of a device for generating the plurality of signals, the at least one electrical property including at least one of a capacitance, a resistance, and an inductance.

10. The method of claim 1 wherein the set of variables includes at least one electrical property of a device for measuring the set of voltage values and the set of current values, the at least one electrical property including at least one of a capacitance, a resistance, and an inductance.

11. The method of claim 1 wherein the number of equations in the set of equations is equal to the number of unmeasured variables variable in the set of variable, the unmeasured variables being not measured directly.

12. The method of claim 1 wherein the monitored component comprises an electrode.

13. The method of claim 1 wherein the monitored component comprises a lower electrode, the lower electrode configured to support a substrate for processing in the plasma processing system.

14. The method of claim 1 wherein the at least one parameter of the monitored component includes a capacitance.

15. The method of claim 1 wherein the at least one parameter of the monitored component includes a resistance.

16. The method of claim 1 wherein the at least one parameter of the monitored component includes an inductance.

17. The method of claim 1 wherein the at least one of the upper electrode and the lower electrode is both of the upper electrode and the lower electrode.

18. The method of claim 1 wherein the set of variables includes at least one electrical property of the signal generator.

19. The method of claim 1 wherein the set of variables includes at least one electrical property of the electrical measuring device.

20. A plasma processing system comprising:
   a monitored component;
   a signal generator configured to generate a plurality of signals associated with different frequencies, at least two of the plurality of signals being provided to the plasma processing system at different times;
   an electrical measuring device configured to measure a set of voltage values, a set of phase values, and a set of current values associated with at least one of an upper electrode and a lower electrode of the plasma processing system for the plurality of signals; and
   at least one computer device configured to: (a) store a mathematical relation between an impedance and a set of variables, the set of variables including at least one parameter of the monitored component, (b) calculate a set of values of the impedance using the set of voltage values, the set of phase values, and the set of current values, and (c) calculate a value of the at least one parameter of the monitored component using the mathematical relation and the set of values of the impedance.

21. The plasma processing system of claim 20 wherein the at least one computing device is further configured to:
   store a range; and
   compare the value of the at least one parameter of the monitored component with the range.

* * * * *